United States Patent [19]

Mlynko

[11] Patent Number: 4,853,081
[45] Date of Patent: Aug. 1, 1989

[54] PROCESS FOR REMOVING CONTAMINANT

[75] Inventor: Walter E. Mlynko, Burlington, Vt.

[73] Assignee: IBM Corporation, Armonk, N.Y.

[21] Appl. No.: 114,941

[22] Filed: Oct. 30, 1987

[51] Int. Cl.⁴ .................. B44C 1/22; H01L 21/306
[52] U.S. Cl. .................... 156/643; 156/640; 156/644; 156/662; 156/902
[58] Field of Search .......... 156/640, 643, 644, 662, 156/902, 901

[56] References Cited

U.S. PATENT DOCUMENTS

| | | | |
|---|---|---|---|
| 4,012,307 | 3/1977 | Phillips | 240/192 E |
| 4,162,932 | 7/1979 | Konicek | 156/630 |
| 4,328,081 | 5/1982 | Fazlin | 204/192 E |
| 4,425,210 | 1/1984 | Fazlin | 204/19 ZE |
| 4,496,420 | 1/1985 | Frohlich et al. | 156/902 |
| 4,540,464 | 9/1985 | Mueller et al. | 156/902 |
| 4,544,439 | 10/1985 | Solomon et al. | 156/902 |
| 4,599,134 | 7/1986 | Babu et al. | 156/902 |
| 4,615,763 | 10/1986 | Gelorme et al. | 156/902 |
| 4,654,115 | 3/1987 | Egitto et al. | 156/643 |
| 4,667,058 | 5/1987 | Catalano et al. | 156/643 |

Primary Examiner—David L. Lacey
Assistant Examiner—L. Johnson
Attorney, Agent, or Firm—Pollock, Vande Sande & Priddy

[57] ABSTRACT

Contaminant is removed from the interior of the holes in the vicinity of preselected locations by etching in a gaseous plasma wherein the sheath voltage is controlled in order to direct ions of the plasma to contact the interior of the holes in the vicinity of the preselected locations.

11 Claims, 1 Drawing Sheet

PROCESS FOR REMOVING CONTAMINANT

DESCRIPTION

TECHNICAL FIELD

The present invention is concerned with removing contaminant from holes and particularly from holes provided in circuit boards and circuit cards. The present invention is especially concerned with removing contaminant by subjecting the article to a gaseous plasma. The present invention provides for selectively removing contaminant from the interior of the holes within the vicinity of preselected locations within the holes without over-etching the outer edges of the hole.

BACKGROUND ART

In the manufacture of printed circuit cards and boards, a dielectric sheet material is employed as a substrate. A conductive circuit pattern is provided on one or both of the major surfaces of the substrate.

Multilayer cards and boards are typically constructed of a number of layers of copper conductor patterns separated by layers of dielectric plastic. These structures can be produced by laminating techniques.

In order to provide electrical connection between layers, holes referred to as "through-holes" are provided in the circuit boards and cards and such are subsequently plated with an electrically conductive coating such as copper.

However, in the process for producing the holes, invariably some amount of contaminant is formed within and around the edges of the holes.

For instance, when drilling a dielectric substrate such as obtained from an epoxy material, what is commonly referred to as "epoxy smear" due to the drilling results within the hole and around the edges of the hole. Accordingly, prior to electrically plating the holes, the contaminant must be removed to as great an extent as possible. Various treatments have been suggested for removing such contaminant including subjecting the substrate to a gaseous plasma. However, it has been observed that while many gaseous plasma systems are effective for removing the contaminant within the vicinity of the edges of the holes that such are much less effective in removing contaminant from the interior of the holes and particularly within the vicinity of the interplanes of the holes.

The interplanes of the holes represent those locations within the holes where the copper conductor layers exist.

One troublesome problem with plasma etching to remove contaminant from holes is that if the etching process is continued for sufficient time in order to remove substantial contaminant from the interior of the holes, then the outer edges of the holes due to the additional etching time become over-etched. These problems are particularly pronounced when dealing with holes having a relatively high aspect ratio. The aspect ratio is the depth of the hole relative to its diameter.

The above-discussed problem, as well as one particular technique for overcoming the problem, is disclosed in U.S. Pat. No. 4,654,115 to Egitto, et al., disclosure of which is incorporated herein by reference.

SUMMARY OF INVENTION

The present invention is concerned with a process for removing contaminant from holes.

In particular, the present invention is concerned with a process for removing contaminant selectively from the interior of holes in the vicinity of preselected locations within the holes by etching in a gaseous plasma.

It has been found, in accordance with the present invention, that the ions of the plasma can be selectively directed to contact the interior of the holes in the vicinity of preselected or predetermined locations by selecting or controlling the value of the sheath voltage. The sheath voltage is that voltage which exists outside of the hole between the substrate and the plasma.

SUMMARY OF DRAWING

The FIGURE is a schematic diagram of a through-hole and proximity to a plasma.

BEST AND VARIOUS MODES FOR CARRYING OUT INVENTION

Figure 1:
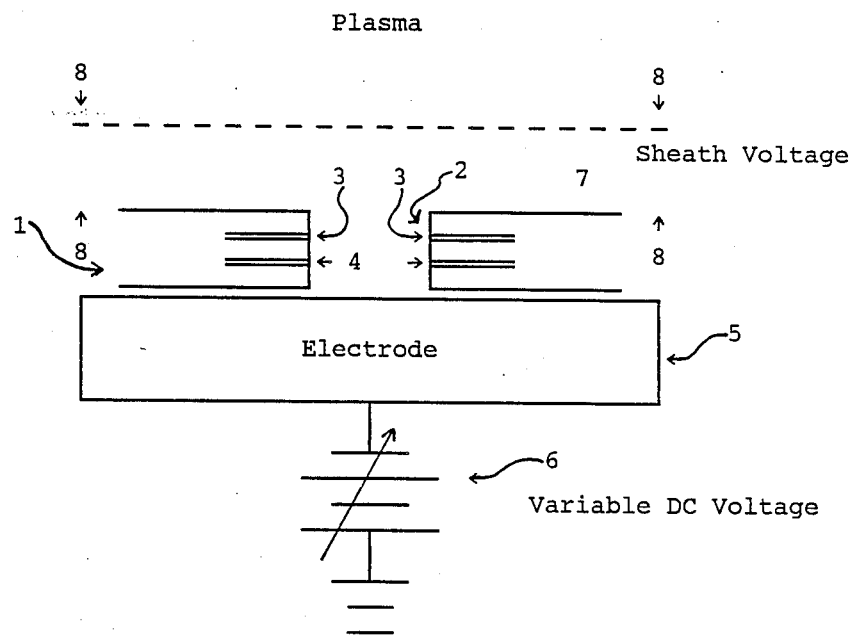

The process of the present invention is concerned with removing contaminant from holes and is especially concerned with removing contaminant from holes provided in dielectric substrates; particularly those employed for use in electronic circuit boards and circuit cards.

In particular, the present invention is concerned with removing contaminant from preselected locations within the interior of the holes such as in the vicinity of the interplanes of the holes. It is especially important to remove contaminant from the vicinity of the interplanes within the holes in order to assure adequate electrical connections with the conductor patterns located in the various layers of the cards or boards.

Holes in various dielectric substrates including substrates from thermoplastic and thermosetting resins may be treated pursuant to the present invention.

Typical thermosetting polymeric materials include epoxy, phenolic-based materials, polyimides, and polyamides. The dielectric material may be molded articles of the polymers containing fillers and/or reinforcing agents such as glass-filled epoxy or phenolic-based materials. Examples of some phenolic-type materials include copolymers of phenol, resorcinol, and cresol. Examples of some suitable thermoplastic polymeric materials include polyolefins such as polypropylene, polysulfones, polycarbonates, nitrile rubbers, and ABS polymers.

Typical epoxy resins include the bisphenol A type resins obtained from bisphenol A and epichlorohydrin, resinous materials obtained by the epoxidation of novolak resins produced from a phenolic material such as phenol and an aldehyde such as formaldehyde with epichlorohydrin, polyfunctional epoxy resins such as tetraglycidyldiaminodiphenyl methane, and alicyclic epoxy resins such as bis(3,4-epoxy-6-methyl-cyclohexamethyl) adipate. The most preferred epoxy employed is of the bisphenol A type.

Also, the resinous epoxy compositions can contain accelerating agents and curing agents, as well-known in the art. Examples of suitable curing agents include polyamines, primary, secondary, and tertiary amines, polyamides, polysulfones, urea-phenol-formaldehyde, and acids or anhydrides thereof. In addition, suitable curing agents include Lewis acid catalysts such as $BF_3$ and complexes thereof.

The dielectric substrate usually contains fillers and/or reinforcing fibers such as glass fibers. Such compositions containing fibers are usually prepared by impregnating the fibers with the epoxy composition. The amount of the epoxy composition when combined with the fibers is usually about 30% to about 70% by weight and preferably about 55% to about 65% by weight of the total of the solids content of the epoxy composition and the fiberglass.

After combining with the reinforcing fibers, the composition is cured to the B-stage and molded to the desired shape, such as a sheet commonly referred to as a prepreg. When sheets are employed, the thickness is usually about 1.5 mils to about 8 mils and preferably about 2 mils to about 3 mils. The curing to the B-stage is generally achieved by using temperatures of about 80° C. to about 110° C. and for times of about 3 minutes to about 10 minutes.

After the prepreg is formed, a sheet of copper or other conductive material can then be laminated to one or more layers of prepreg using laminating conditions such as about 50 psi to about 800 psi, and more usually about 200 psi to about 500 psi, at about 150° C. to about 200° C. for about 30 minutes to about 5 hours. Then a circuit can be etched to the conductive layer using techniques well-known to form circuit boards. Multilayer boards and cards are formed by laminating together the desired number of such boards.

The through-holes are provided in the dielectric substrate and must be subsequently provided with an electrical conductor such as copper in order to provide electrical connection between circuits on opposing surfaces of the dielectric substrate. These through-holes can be provided by mechanical operations such as drilling and punching or by processing, such as by use of a laser. However, the formation of the holes results in contaminant present in the interior of the holes and around the vicinity of the edges of the hole which is generally referred to as "smear". A large portion of this contaminant is from the dielectric material in the substrate; for instance, when the dielectric is an epoxy, the contaminant is predominantly epoxy smear.

It is essential for reliable plating of the through-holes to remove as much of the contaminant as possible. Removal of contaminant selectively in the interior of the holes within the vicinity of preselected locations within the holes is accomplished in accordance with the present invention. The contaminant is removed by etching in a gaseous plasma.

Objects that are placed into a gaseous plasma acquire a negative bias with respect to the plasma. This bias causes the object to be bombarded with positive ions as discussed, for example, in Chapman, *Glow Discharge Processes*, Wiley. In order to provide for the ions to contact preselected locations within the interior of the holes, according to the present invention, the sheath voltage is properly controlled so that there exists a curved path for the ions directed to the preselected locations. This curved path is related to the radial electric field between the axis of the holes and the preselected locations within the holes, such as the interplanes. The electric field is represented by the following known equation:

$$E = \frac{Q}{2\pi\epsilon_0 RL}$$

wherein:
Q is the total charge of ions in the hole
$\epsilon_o$ is the permitivity of free space
R is the radius of the hole
L is the length of the hole This electric field E causes the ions to curve towards the walls within the hole.

In accordance with the present invention the sheath voltage is controlled to direct the ions of the plasma to contact the predetermined locations within the holes.

The speed of the ions (axial velocity) must be such that the ions do not overshoot or undershoot the predetermined locations within the holes. For instance, if the axial velocity of the ions is too large, then the ions will pass through the holes without contacting the walls at the predetermined locations. If the axial velocity of the ions is too slow, then the ions will contact the interior of the hole in the vicinity of the entrance of the holes.

The sheath voltage can be manipulated by several different techniques. Some methods of controlling the sheath voltage are controlling the RF power to the plasma, the frequency of the RF power to the plasma, providing a separate independent electrode in the system, and placing an appropriate voltage in it, creating a plasma difference between applied RF power to the plasma and RF power directly applied to the board or card, and providing electrodes into the board or card to generate power within preselected locations within the hole.

Whichever method is selected, the particular sheath voltages can be selected by persons skilled in the art without undue experimentation for the particular conditions involved once such persons are aware of the present disclosure and invention. For instance, see Keller, et al., "Electrical Properties of RF Sputtering Systems", *IBM Journal of Research and Development*, Vol. 23, Number 1, January 1979, disclosure of which is incorporated herein by reference, for a discussion of sheath voltage and manipulation of sheath voltage.

There are three methods for controlling the sheath voltage discussed by Keller, et al. These methods are referred to as:
1. Tunnel substrate
2. Driven
3. CARE.

In particular, with the substrate drive voltage $V_d$ equal to zero, the system is a tuned substrate system; with the impedance $Z_{es}$ equal to zero, it is a driven system; with both equal to zero, it is a controlled area ratio electrode (CARE) system.

In the tuned substrate system a variable inductor and a blocking capacitor are placed in series between the substrate and ground (stray capacitance to ground of the order of 100 pF or more.) The tuning network is usually designed to adjust over a range including both series resonance with the blocking capacitor and parallel resonance with the stray capacitance.

In a driven substrate system some of the rf power from the generator is used to drive the substrate holder at a given rf voltage and phase. Two synchronized generators may also be used for driving the target and substrate.

In a CARE system the plasma voltage corresponds to the ion bombardment potential at the substrate. CARE stands for Controlled Area Ratio of Electrodes. Equation 35 given by Koenig and Maissel, IBM Journal Research Development, 14, 168(1970), below shows that the plasma voltage $V_p$ depends on the area ratio of electrodes $A_t/A_w$ and $A_s/A_t$.

$$V_p^{\frac{1}{2}} = (V_t - V_p)^{\frac{1}{2}} \frac{A_t}{A_w} \left[ 1 \pm \left( \frac{A_s}{A_t} \right) \left| \frac{V_d - V_p}{V_t - V_p} \right|^{\frac{1}{2}} \right], \quad (35)$$

$V_t$ refers to the target voltage and $V_d$ refers to the substrate drive voltage. Thus, the sheath voltage which is proportioned to the plasma voltage; can be adjusted by adjusting the area of the electrodes in contact with the plasma.

By manipulating the sheath voltage, a plurality of locations within the holes can be contacted by the plasma. For instance, this can be accomplished by scanning the voltage from one preselected location to the next preselected location such as by using a variable DC voltage source and scanning or changing it from one value for the first preselected location to the next value for the next preselected location.

To facilitate understanding of the present invention, reference is hereby made to the FIGURE wherein numeral 1 represents the substrate having holes (2) therein and interplanes (3) and (4). The substrate (1) is shown located on the electrode (5) of the plasma generating apparatus which, in turn, is connected to variable DC voltage (6). Upon creation of the plasma, a sheath voltage (7) is generated between the substrate and plasma as shown by arrows (8,8). By properly varying the sheath voltage, such as by varying the DC voltage, the ions of the plasma can be made to first contact interplane (3) and then interplane (4).

The present invention is especially advantageous for removing contaminant from the interior of relatively high aspect ratio holes, such as at least about 3:1 and generally at least about 9:1.

The sheath voltage is usually about 15 volts to about 750 volts and more usually about 50 volts to about 250 volts.

The gaseous plasma is formed from an oxygen-containing gas and a fluorinated compound. The relative amounts of the oxygen-containing gas and the fluorinated compound are selected so as to remove contaminant from the interior of the holes in the vicinity of the preselected locations.

Preferred oxygen-containing gas employed is oxygen per se. Suitable fluorinated compounds include $CF_4$, $C_2F_6$, $CFCl_3$, $CF_3Cl$, $SF_6$, $CCl_2F_2$, and $NF_3$ with the most preferred fluorinated compound being $CF_4$.

The relative amounts of the oxygen-containing gas and the fluorinated compound will depend upon the specific fluorinated compound employed and the particular dielectric substrate material. However, the amounts can be readily determined without undue experimentation by merely determining the maximum etch rates as a function of different gas-feed compositions. Once this is determined for a particular set of conditions, the ranges can then be employed as discussed hereinbelow.

For instance, with $CF_4$ as the fluorinated compound, mole ratios of $O_2$ to $CF_4$ of 60 to 90:40 to 10 are suitable for an epoxy dielectric substrate for this etching step. A typical ratio is about 70:30 of oxygen/$CF_4$. On the other hand, in the same system employing $SF_6$ as the fluorinated compound, the ratio of oxygen/$SF_6$ is about 95 to 80/5 to 20.

This etching step of the process is usually completed within about 5 minutes to about 45 minutes and more usually about 10-25 minutes and is generally carried out from about room temperature to less than the degradation temperature of the dielectric substrate, and more usually about 50° C. to about 130° C. The gas residence time is usually about 1 second to about 5 minutes, and more usually about 1 second to about 1 minute.

The pressure employed is generally about 100 millitorr to about 500 millitorr. Typical power levels are about 0.05 watts to about 2 watts per square centimeter of one major surface of the dielectric substrate being treated.

Plasma reactors suitable for carrying out the process of the present invention are commercially available and need not be discussed herein in any detail. Typical commercially available plasma reactors suitable for carrying out the present invention are Branson IPC-Parallel Plate Reactor Model 74-15; in-line plasma system available from Koksai, Applied Plasma System's plasma reactor; and Technics' plasma reactor.

The process of the present invention provides for selective etching of contaminant from the interior of the holes with a minimum of unnecessary etchback or overetching away from the preselected locations within the hole. Furthermore, the present invention makes it possible to increase the speed of the overall process, thereby providing advantages of a commercial nature.

Having thus described out invention, what we claim as new and desire to secure by letters patent is:

1. A process for removing contaminant from holes located in a substrate and having an entrance, outer edges and interior walls which comprises etching said holes having contaminant present on the interior walls of the holes in a gaseous plasma to selectively remove contaminant from the interior of the holes in preselected locations within said holes whereby a sheath voltage is generated between said substrate and said plasma by controlling the value of the sheath voltage to direct ions of the plasma in a curved path to contact the interior of said holes in the vicinity of said preselected locations in order to selectively remote contaminant therefrom without overetching the outer edges of the holes.

2. The process of claim 1 wherein said preselected locations are interplanes.

3. The process of claim 1 wherein said sheath voltage is varied from a first value to a second value to cause ions of the plasma to contact first preselected locations within said holes and then to contact second preselected locations within said holes.

4. The process of claim 1 wherein the aspect ratio of said holes is at least about 3:1.

5. The process of claim 1 wherein the aspect ratio of said holes is at least about 9:1.

6. The process of claim 1 wherein the sheath voltage is controlled so that said ions of the plasma do not contact the interior of the holes in the vicinity of the entrance of the holes.

7. The process of claim 1 wherein said gaseous plasma is formed from oxygen and a fluorinated compound.

8. The process of claim 7 wherein the fluorinated compound is selected from the group of $CF_4$, $C_2F_6$, $CFCl_3$, $CF_3Cl$, $SF_6$, $NF_3$, and $CCl_2F_2$.

9. The process of claim 7 wherein said fluorinated compound is $CF_4$.

10. The process of claim 1 wherein said holes are located in dielectric substrate.

11. The process of claim 10 wherein said dielectric substrate is an epoxy substrate.

* * * * *